(12) United States Patent
Kim (10) Patent No.: US 8,157,916 B2
(45) Date of Patent: Apr. 17, 2012

(54) APPARATUS FOR FABRICATING DISPLAY DEVICE

(75) Inventor: Jae-Ho Kim, Seoul (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 1003 days.

(21) Appl. No.: 11/255,062

(22) Filed: Oct. 19, 2005

(65) Prior Publication Data
US 2006/0090705 A1    May 4, 2006

(30) Foreign Application Priority Data
Oct. 28, 2004  (KR) ................. 10-2004-0086470

(51) Int. Cl.
*C23C 16/00* (2006.01)
(52) U.S. Cl. ...................................... 118/726
(58) Field of Classification Search .............. 118/726
See application file for complete search history.

(56) References Cited

U.S. PATENT DOCUMENTS

| | | | |
|---|---|---|---|
| 3,914,515 A * | 10/1975 | Kane et al. .......................... 430/5 |
| 4,620,984 A * | 11/1986 | Hoddinott .......................... 427/9 |
| 5,630,881 A * | 5/1997 | Ogure et al. .................. 118/730 |
| 5,837,316 A * | 11/1998 | Fuchita .......................... 427/191 |
| 6,235,121 B1 * | 5/2001 | Honma et al. ................. 118/730 |
| 6,513,451 B2 | 2/2003 | Van Slyke et al. |
| 6,572,706 B1 * | 6/2003 | Nguyen et al. ................ 118/724 |
| 6,749,906 B2 | 6/2004 | Van Slyke |
| 6,863,736 B2 * | 3/2005 | Leavitt et al. ................. 118/730 |
| 2002/0185069 A1 * | 12/2002 | Hoffmann et al. ........... 118/726 |
| 2003/0054099 A1 * | 3/2003 | Jurgensen et al. ......... 427/248.1 |
| 2004/0132302 A1 * | 7/2004 | Choi ............................. 438/689 |
| 2005/0066900 A1 * | 3/2005 | Liu et al. ...................... 118/726 |

FOREIGN PATENT DOCUMENTS

| | | |
|---|---|---|
| KR | 2002-0082127 | 12/2002 |
| KR | 0432704 | 5/2004 |

OTHER PUBLICATIONS

English Language Abstract of Korean Publication No. KR2002-0082127.
English Language Abstract of Korean Patent No. KR0432704.

* cited by examiner

*Primary Examiner* — Maureen Gramaglia
(74) *Attorney, Agent, or Firm* — Portland IP Law LLC

(57) ABSTRACT

An apparatus for forming a thin film includes: a chamber; a susceptor in the chamber; a gas injector over the susceptor, the gas injector having a plurality of injection holes; a shaft connected to the gas injector, the shaft having a flow path connected to the plurality of injection holes; and an evaporation source evaporating source materials and supplying evaporated source materials to the gas injector.

18 Claims, 9 Drawing Sheets

APPARATUS FOR FABRICATING DISPLAY DEVICE

BACKGROUND OF THE INVENTION

The present invention claims the benefit of Korean Patent Application No. 2004-0086470 filed in Korea on Oct. 28, 2004, which is hereby incorporated by reference.

1. Field of the Invention

The present invention relates to an apparatus for a display device, and more particularly, to an apparatus having a gas injector.

2. Discussion of the Related Art

Flat panel display (FPD) devices having portability and low power consumption have been a subject of increasing research in the present information age. Among the various types of FPD devices, liquid crystal display (LCD) devices are commonly used in notebook and desktop computers because of their high resolution, capability of displaying colored images, and high quality image display. However, LCD devices are not an emissive type but a non-emissive type. Accordingly, LCD devices have limitations in brightness, contrast ratio, viewing angle and size enlargement.

To overcome the limitations of LCD devices, organic electroluminescent display (OELD) devices have been researched. Since OELD devices are an emissive type, viewing angel and contrast ratio are improved in contrast with LCD devices. In addition, since a backlight unit is not required, OELD devices have portability and low power consumption. Specifically, OELD devices can be manufactured at a low cost and a simple process; particularly since a manufacturing process of OELD devices is very simple in contrast with LCD devices or plasma display panel (PDP) devices, only deposition and encapsulation apparatuses are necessary for manufacturing OELD devices.

Figure 1:
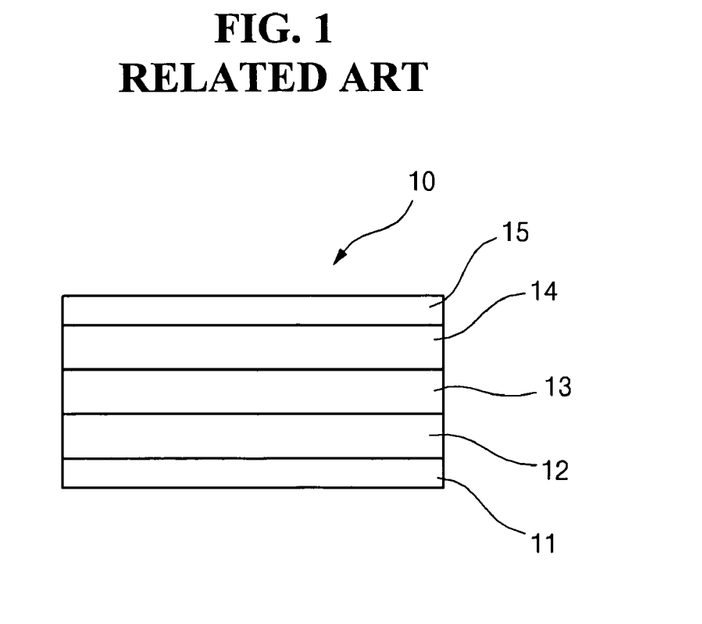
FIG. 1 is a schematic cross-sectional view showing an organic electroluminescent display device according to the related art.

FIG. 1 is a schematic cross-sectional view showing an organic electroluminescent display device according to the related art. In FIG. 1, an organic electroluminescent display device 10 includes an anode 11, a cathode 15, and an emission layer 13 between the anode 11 and the cathode 15. A hole transporting layer 12 is formed between the anode 11 and the emission layer 13, and an electron transporting layer 14 is formed between the cathode 15 and the emission layer 13. The hole transporting layer 12, the emission layer 13 and the electron transporting layer 14 may be formed of an organic material. In addition, the anode 11 may be formed of indium-tin-oxide (ITO) and the cathode 15 may be formed of aluminum (Al).

When voltages are applied to the anode 11 and the cathode 15, holes are injected from the anode 11 into the emission layer 13 through the hole transporting layer 12 and electrons are injected from the cathode 15 into the emission layer 13 through the electron transporting layer 14. The holes and the electrons are recombined in the emission layer 13 to generate excitons. The excitons are transitioned from an excited state to a ground state so that light can be irradiated from the emission layer 13 for displaying images. The emission layer may include organic materials that emit red, green and blue colors of light in each pixel region. For example, the organic materials may be selected from one of Alq3, CuPc, TDP and NPB. In addition, dopants are added into the organic materials to display different colors. For example, DCJTB may be added for red color. Similarly, coumarine derivatives or quinacridone derivatives may be added for green color, and DPA may be added for blue color.

A layer including organic materials may be formed using evaporation. Accordingly, source organic materials in a solid state are evaporated and the evaporated source organic materials are deposited on a substrate. A shadow mask having a pattern may be disposed over the substrate and the substrate may be partially exposed through the shadow mask.

Figure 2A:
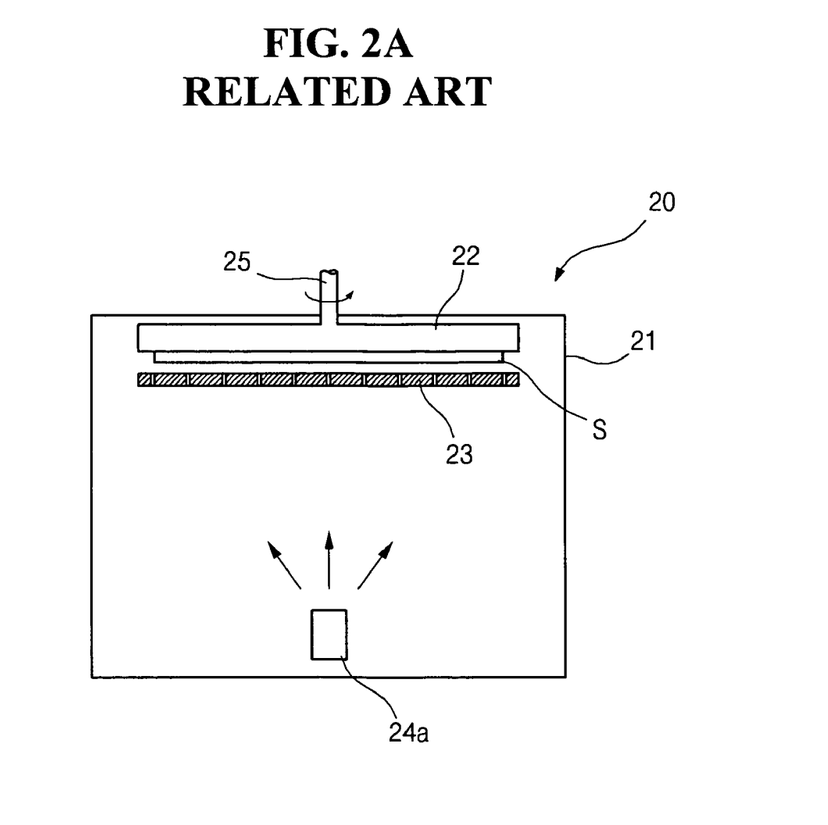
FIGS. 2A to 2C are schematic cross-sectional views showing evaporation apparatuses for forming an organic material thin film according to the related art.
Figure 2B:
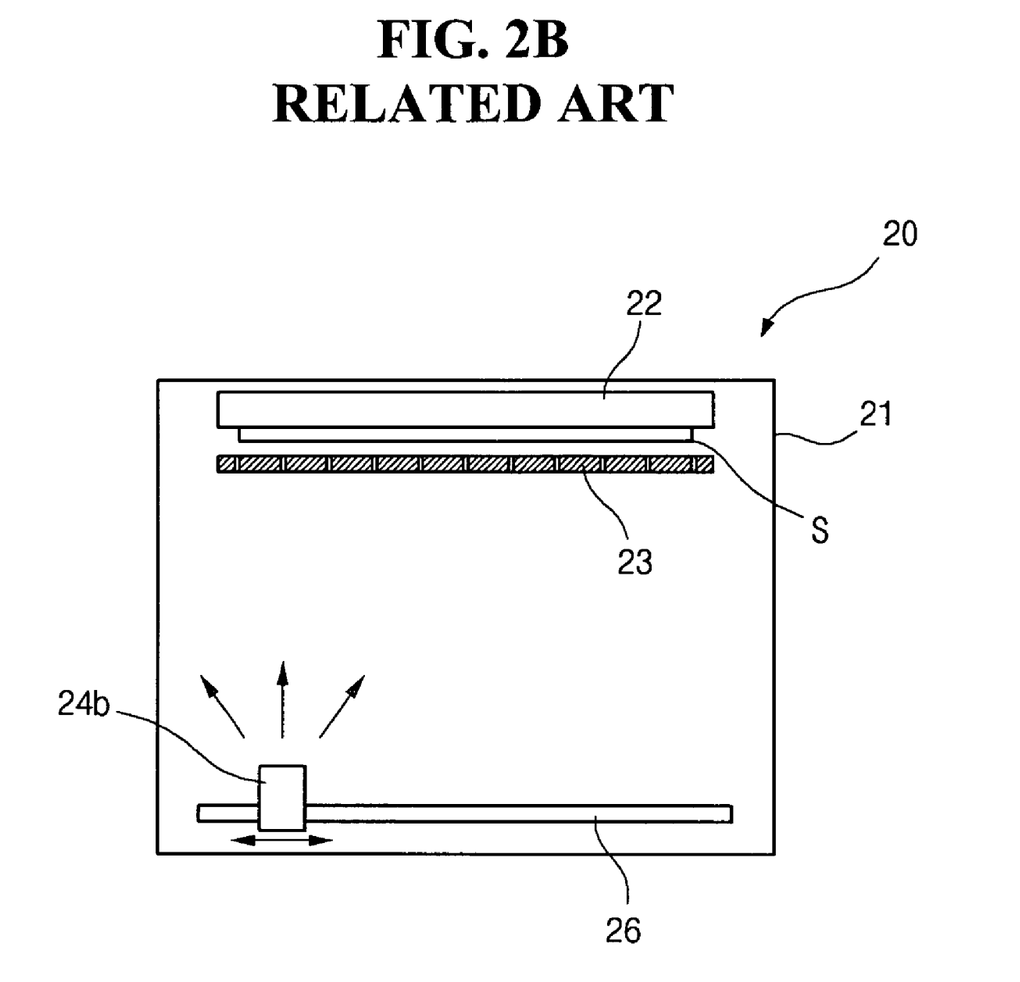
Figure 2C:
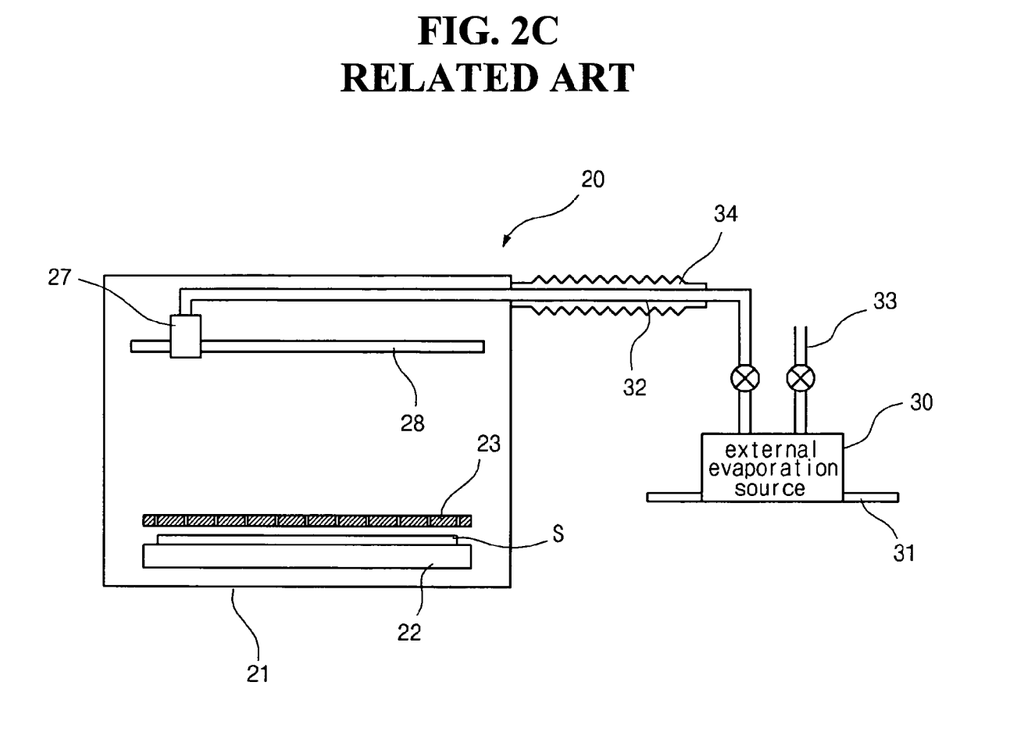

FIGS. 2A to 2C are schematic cross-sectional views showing evaporation apparatuses for forming an organic material thin film according to the related art. In FIG. 2A, a susceptor 22 and a point evaporation source 24a are disposed at an upper portion and a lower portion in a chamber 21 of an evaporation apparatus 20, respectively. A substrate "S" is adhered to a bottom surface of the susceptor 22 and a shadow mask 23 having open patterns is disposed between the substrate and the point evaporation source 24a. The shadow mask 23 may be disposed adjacent to the substrate "S." Source organic materials are evaporated in the point evaporation source 24 and the evaporated source organic materials is deposited onto the substrate "S" through the open patterns of the shadow mask 23. For example, a ceramic crucible heated by a hot wire may be used as the point evaporation source 24a. To improve uniformity of a thin film formed on the substrate "S," the substrate "S" is disposed far from the point evaporation source 24a so that the evaporated organic materials can be sufficiently diffused. In addition, the susceptor 22 having the substrate "S" may be rotated about a rotation axis 25.

In FIG. 2B, a susceptor 22 and a line evaporation source 24b are disposed at an upper portion and a lower portion in a chamber 21 of an evaporation apparatus 20, respectively. The line evaporation source 24b horizontally moves along a transfer line 26 and has a bar shape perpendicular to the transfer line 26. A substrate "S" is adhered to a bottom surface of the susceptor 22 and a shadow mask 23 having open patterns is disposed between the substrate and the line evaporation source 24b. Since the line evaporation source 24b moves, the substrate "S" may not rotate. The shadow mask 23 may be disposed adjacent to the substrate "S." Source organic materials are evaporated in the line evaporation source 24b and the evaporated source organic materials is deposited onto the substrate "S" through the open patterns of the shadow mask 23.

In FIG. 2C, a susceptor 22 and a line injector 27 are disposed at a lower portion and an upper portion in a chamber 21 of an evaporation apparatus 20, respectively. Organic materials are evaporated in an external evaporation source 30 outside the chamber 21 and are supplied to the line injector 27. Carrier gases are supplied to the external evaporation source 30 through a carrier gas inlet 33 to carry the evaporated organic materials. Accordingly, the evaporated organic materials and the carrier gases mixed in the external evaporation source 30 are supplied to the line injector 27 through a source gas inlet 32. A substrate "S" is disposed on a susceptor 22, and a shadow mask 23 having open patterns is disposed between the line injector 27 and the substrate "S." In addition, the line injector 27 horizontally moves along a transfer line 28 and has a bar shape perpendicular to the transfer line 28.

Accordingly, the line injector 27 in the chamber 21 sprays the organic materials evaporated outside the chamber 21 onto the substrate "S" through the open patterns of the shadow mask 23. When the line injector 27 moves along the transfer line 28, the external evaporation source 30 connected to the line injector 27 through the source gas inlet 32 moves along an external transfer line 31. A bellows is formed in a border region between the chamber 21 and the source gas inlet 32 for airtightness.

However, there are several drawbacks in evaporation apparatuses according to the related art. To obtain superior uniformity of a thin film in an evaporation apparatus of FIG. 2A, the chamber 21 should be kept in a high vacuum condition to increase evaporation pressure of the organic materials. In addition, a distance between the substrate "S" and the point evaporation source 24a should be maximized. Accordingly, efficiency of the organic materials is very low, and uniformity of a thin film is reduced as the substrate size increases. Moreover, since the shadow mask 23 is disposed under the substrate "S," the shadow mask 23 may be warped. In addition, as the substrate "S" increases in size, the line evaporation source 24b of an evaporation apparatus of FIG. 2B is elongated. As a result, amount of the organic materials also increases. In addition, since a distance between the substrate "S" and the line evaporation source 24b should be maximized for superior uniformity, efficiency of the organic materials is reduced. Further, since the shadow mask 23 is disposed under the substrate "S," the shadow mask 23 may be warped as in FIG. 2A. In an evaporation apparatus of FIG. 2C, warpage of the shadow mask 23 is prevented because the shadow mask 23 is disposed on the substrate "S." However, as the substrate size increases, the source gas inlet 32 through which the evaporated organic materials are supplied to the line injector 27 is elongated. In addition, since the external evaporation source 30 moves corresponding to the line injector 27, a footprint of the evaporation apparatus increases. Further, since the source gas inlet should be kept in a high temperature condition, for example, 100° C. to 500° C., to prevent re-condensation of the evaporated organic materials during a transfer, the evaporation apparatus becomes complicated. The above drawbacks are not limited to an evaporation apparatus using organic materials but may occur in an apparatus evaporating source materials for display devices.

SUMMARY OF THE INVENTION

Accordingly, the present invention is directed to an apparatus for fabricating a display device that substantially obviates one or more of the problems due to limitations and disadvantages of the related art.

An object of the present invention is to provide an apparatus having a superior uniformity of a thin film with a minimized footprint.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for forming a thin film includes: a chamber; a susceptor in the chamber; a gas injector over the susceptor, the gas injector having a plurality of injection holes; a shaft connected to the gas injector, the shaft having a flow path connected to the plurality of injection holes; and an evaporation source evaporating source materials and supplying evaporated source materials to the gas injector.

In another aspect, an apparatus for forming a thin film includes: a chamber; a susceptor in the chamber; a gas injector over the susceptor, the gas injector having a plurality of injection holes; a shaft connected to the gas injector, the shaft having a flow path connected to the plurality of injection holes; a plurality of evaporation sources evaporating source materials and supplying evaporated source materials to the gas injector; and a source material supplier supplying the source materials to the flow path.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Since the present invention relates to a plasma apparatus such as a plasma enhanced chemical vapor deposition (PECVD) apparatus and an etcher where process gases are excited to a plasma state in a chamber and contact a substrate, the plasma apparatus may be a fabrication apparatus for a liquid crystal display (LCD) device or a semiconductor device. In addition, the substrate may be a glass substrate for an LCD device or a wafer for a semiconductor device.

Figure 3:
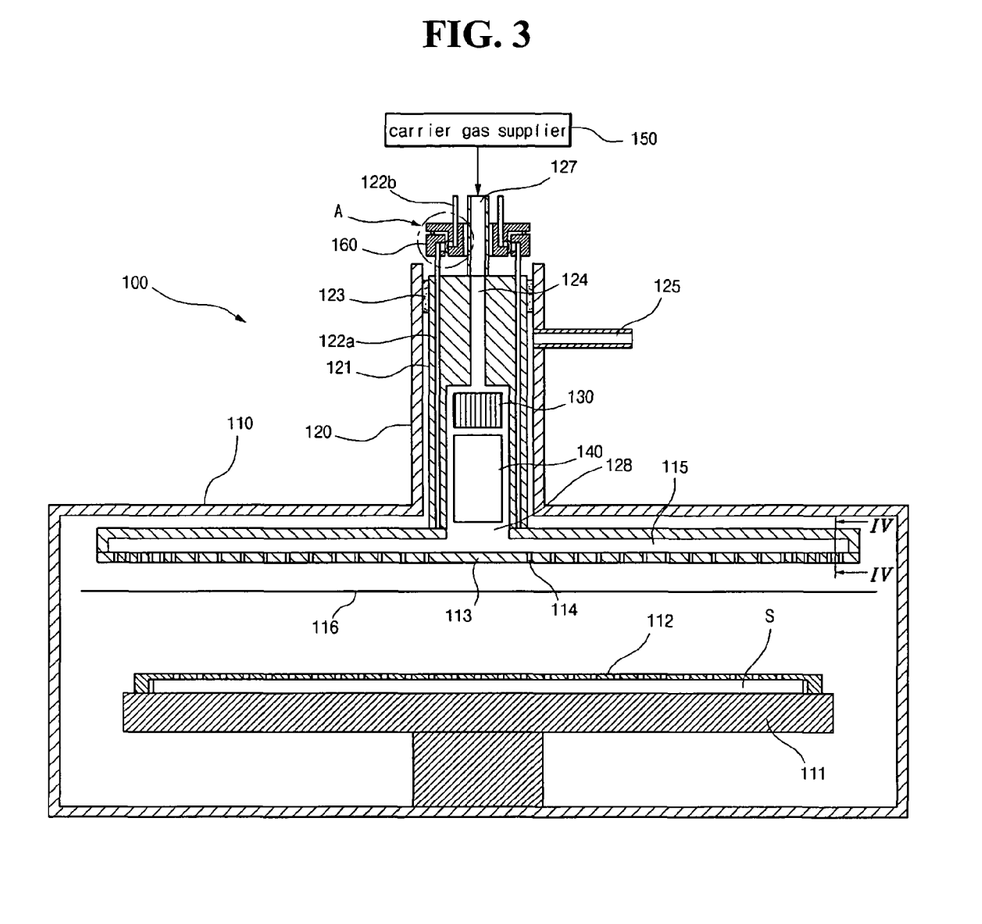
FIG. 3 is a schematic cross-sectional view showing an evaporation apparatus for forming an organic material thin film according to an embodiment of the present invention.

FIG. 3 is a schematic cross-sectional view showing an evaporation apparatus for forming an organic material thin film according to an embodiment of the present invention.

In FIG. 3, a susceptor 111 and a gas injector 113 are disposed at a lower portion and an upper portion, respectively, in a chamber 110 of an evaporation apparatus 100. The gas injector 113 is connected to a rotation shaft 121 disposed at a central top portion of the chamber 110, and an evaporation source 140 is disposed in the rotation shaft 121. In addition, organic materials are evaporated in the evaporation source 140 and the evaporated organic materials are supplied to the gas injector 113. A carrier gas inlet 127 is connected to an upper portion of the rotation shaft 121 and the gas injector 113 is connected to a lower portion of the rotation shaft 121. A flow path 124 and an extension cavity 128 are formed in the rotation shaft 121, and carrier gases from a carrier gas supplier 150 pass through the flow path 124. The extension cavity 128 is connected to the flow path 124 and has a diameter greater than a diameter of the flow path 124 to accommodate the evaporation source 140. Further, the extension cavity 128 is connected to an inner space of the gas injector 113.

The rotation shaft 121 is rotated by a rotating unit (not shown). Since the gas injector 113 rotates with the rotation shaft 121 and sprays the evaporated organic materials onto the substrate "S," a thin film is uniformly formed. Moreover, since the rotation shaft 121 is connected to the gas injector 113 in the chamber 110, a housing 120 is formed to surround the rotation shaft 121 for airtightness from external ambient. A magnetic seal 123 is formed between the fixed housing 120 and the moving rotation shaft 121 for vacuum seal. The magnetic seal 123 is a means using magnetic fluid for sealing a rotation axis. When the magnetic seal 123 is thermally deteriorated or oxidized by the organic materials, a sealing ability of the magnetic seal 123 is abruptly reduced. Accordingly, a purge gas inlet 125 is connected to the housing 120, and diffusion of the organic materials toward the magnetic seal 123 is prevented by purge gases injected through the purge gas inlet 125. The purge gases include nitrogen (N2), argon (Ar) and the other inert gases. Further, since the sealing ability of the magnetic seal 123 is abruptly reduced at a temperature over 150° C., a cooling means (not shown) is connected to the housing 120 to cool down the magnetic seal 123. Even though not shown in FIG. 3, since the moving rotation shaft 121 is connected to the fixed carrier gas inlet 127, an additional magnetic seal is formed between the rotation shaft 121 and the carrier gas inlet 127 for vacuum seal.

Figure 4:
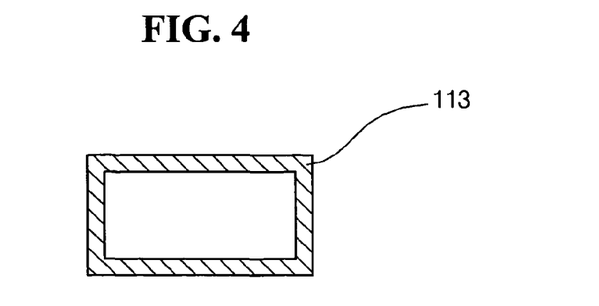
FIG. 4 is a cross-sectional view taken along a line "IV-IV" of FIG. 3.

The gas injector 113 has a tube shape including a plurality of injection holes 114 on a bottom surface thereof. FIG. 4 is a cross-sectional view taken along a line "IV-IV" of FIG. 3. Although the gas injector 113 has a rectangular cross-sectional shape in FIG. 4, the gas injector 113 may has a circular or a polygonal cross-sectional shape in another embodiment. In addition, the gas injector 113 may have a plate shape including a plurality of injection holes on a bottom surface thereon in another embodiment.

Referring again to FIG. 3, a concentration of injection holes 114 varies with a distance from a center of the gas injector 113 to compensate injection pressure. Since the injection pressure decreases along with a distance from the center of the gas injector 113, a concentration of injection holes 114 has a minimum value at the center of the gas injector 113 and gradually increases along with a distance from the center of the gas injector 113.

Figure 5A:
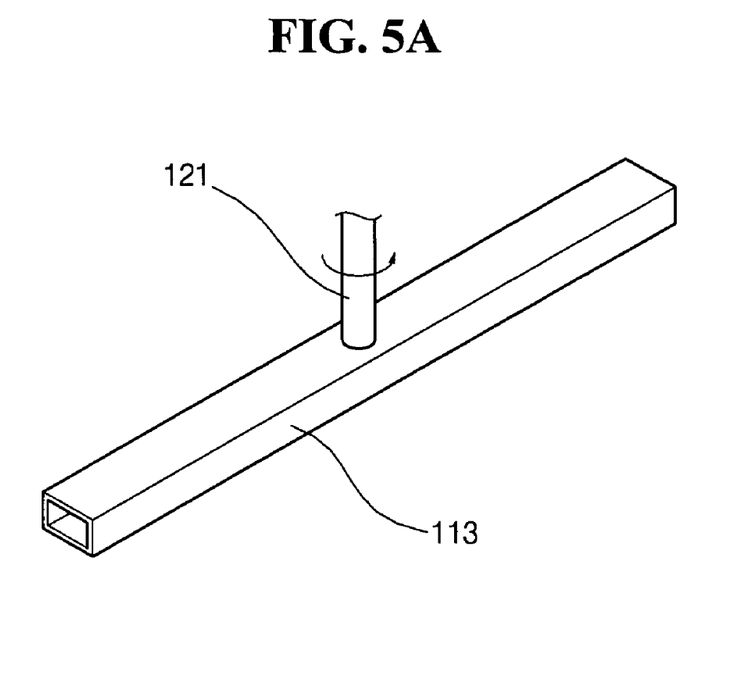
FIGS. 5A and 5B are perspective views showing a gas injector of an evaporation apparatus for forming an organic material thin film according to an embodiment of the present invention.
Figure 5B:
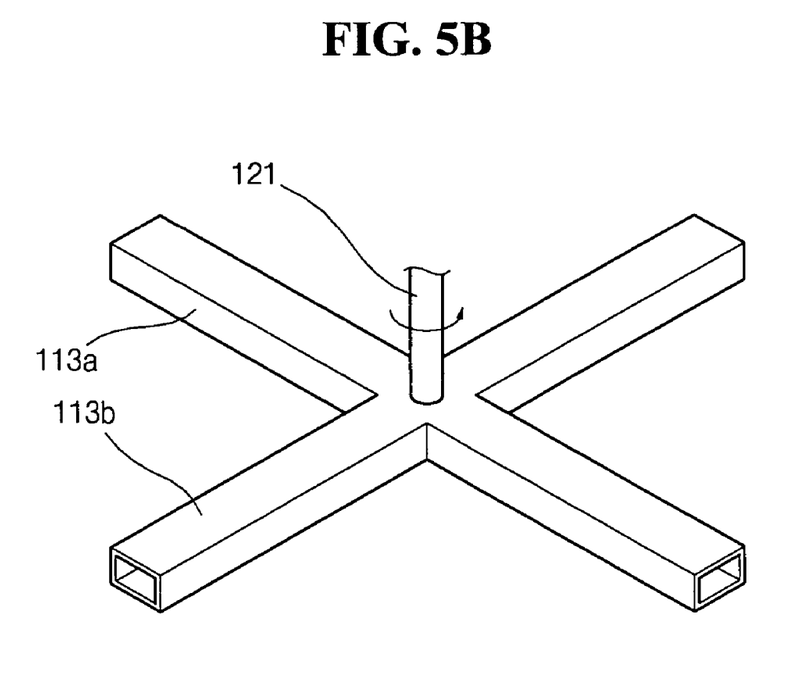

FIGS. 5A and 5B are perspective views showing a gas injector of an evaporation apparatus for forming an organic material thin film according to an embodiment of the present invention. The gas injector 113 has a bar type tube shape in FIG. 5A and has a cross type tube shape including first and second bar type injectors 113a and 113b in FIG. 5B. In addition, the gas injector may include bar type injectors more than three, or may have a plate shape having an inner cavity in another embodiment. In all embodiments, the gas injector includes a plurality of injection holes, and the concentration of injection holes has a minimum value at the center of the gas injector and gradually increases along with a distance from the center of the gas injector. Furthermore, the gas injector of a plate shape may not rotate when a uniform thin film can be obtained.

Referring again to FIG. 3, a heater 130 may be formed in the gas injector 113 to prevent re-condensation of the evaporated organic materials and minimize a temperature variation in the organic materials due to the carrier gases. The heater 130 may heat the evaporated organic materials up to the same temperature as the evaporation source 140. The heating temperature by the heater 130 may be determined by a kind of the organic materials. For example, the heater may heat up within a range of about 100° C. and about 600° C. A power is supplied to the heater 130 through a first power line 122a in the rotation shaft 121. A ceramic crucible having an internal heater (not shown) such as a hot wire may be used as the evaporation source 140. The evaporation source 140 is heated up to a predetermined temperature according to a kind of the organic materials. For example, the evaporation source 140 may be heated up to a range of abut 500° C. to about 600° C. A power is supplied to the internal heater through the first power line 122a in the rotation shaft 121. The first power line 122a may be a single line or a multiple line connected to each of the heater 130 and the evaporation source 140. Even though not shown in FIG. 3, a temperature of the heater 130 and the evaporation source 140 may be measured by a temperature sensing unit such as thermocouple. The temperature sensing unit may be formed in the rotation shaft 121 as the first power line 122a and connected to an exterior power source.

Figure 6:
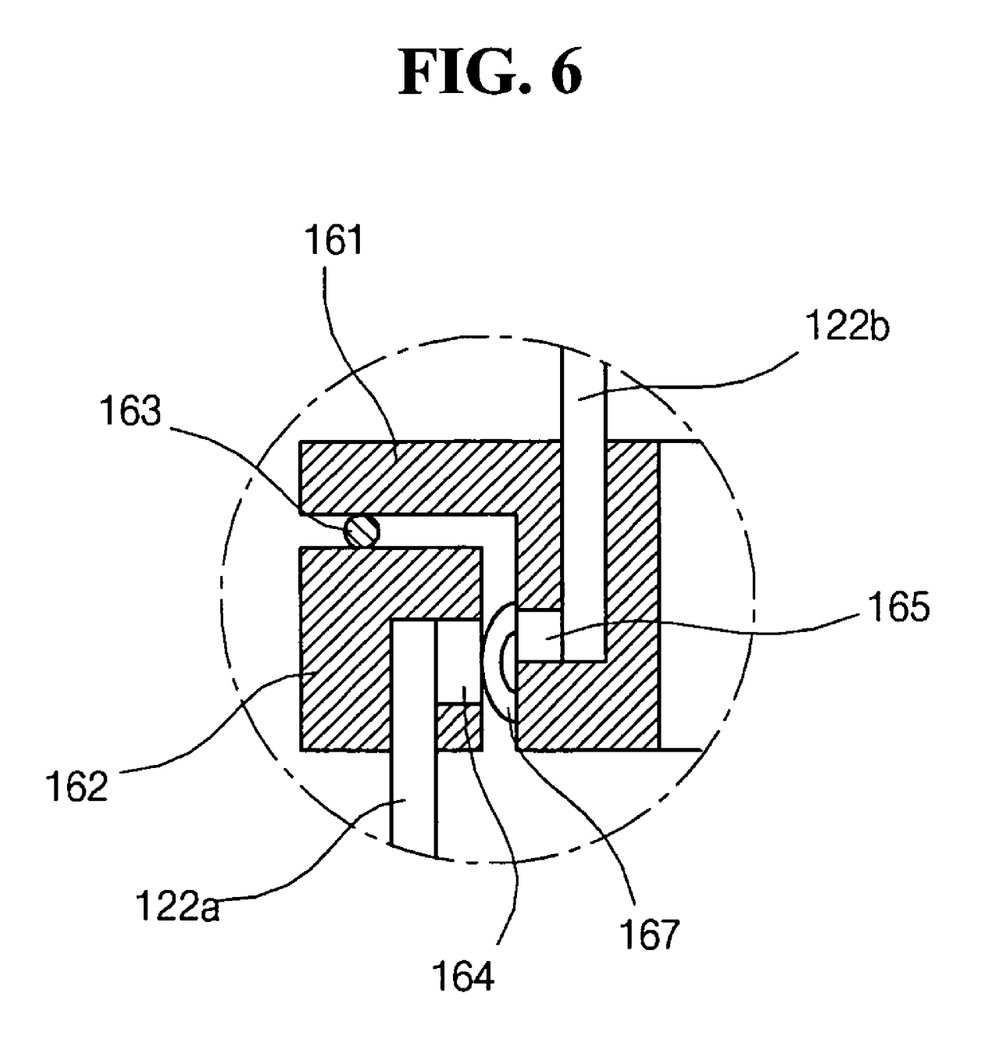
FIG. 6 is a schematic magnified view showing a portion "A" of FIG. 3.

Since the first power line 122a rotates with the rotation shaft 121, a connection means such as a slip ring 160 is used to connect the rotating first power line 122a and a fixed second power line 122b. The second power line 122b is connected to the exterior power source. The slip ring 160 may be used for an electric connection between a rotation axis and a fixed axis or between rotation axes. FIG. 6 is a schematic magnified view showing a portion "A" of FIG. 3. In FIG. 6, the slip ring 160 includes a rotation axis connecting means 162, a fixed axis connecting means 161 and a bearing 163. The first power line 122a is combined to the rotation axis connecting means 162 connected to a rotation axis, and the second power line 122b is combined to the fixed axis connecting means 161 connected to a fixed axis. The rotation axis connecting means 162 and the fixed axis connecting means 161 communicate with each other through the bearing 163 therebetween. The rotation axis connecting means 162 includes a first contact surface 164 contacting the first power line 122a, and the fixed axis connecting means 161 includes a second contact surface 165 contacting the second power line 122b. The first and second contact surfaces 164 and 165 may have a ring shape. A contact terminal 167 having elasticity is disposed between the first and second contact surfaces 164 and 165. For example, a spring may be used as the contact terminal 167. Accordingly, the first and second contact surfaces 164 and 165 are electrically connected to each other even when the rotation axis connecting means 162 rotates. As a result, the first and second power lines 122a and 122b are continuously connected while the rotation shaft 121 rotates.

Referring again to FIG. 3, a shutter 116 is disposed between the gas injector 113 and the susceptor 111 to shield the injected organic materials after the forming process of a thin film. Accordingly, the shutter 116 is open while a thin film is formed on the substrate "S," and then the shutter 116 is closed while the substrate "S" is loaded/unloaded. Even though the rotation shaft 121 of FIG. 3 includes a single evaporation source 140 and a single heater 130, at least two evaporation sources and at least two heaters may be formed in the rotation shaft in another embodiment. The at least two evaporation sources may be disposed to be separated from each other and may be connected to at least two gas injectors, respectively.

A process of forming a thin film using an evaporation apparatus of FIG. 3 will be illustrated hereinafter. After the substrate "S" is loaded on the susceptor 111, the shadow mask 112 having the open patterns are aligned over the substrate "S." A power is supplied to the heater 130 and the evaporation source 140 to obtain a predetermined temperature. The shutter 116 between the gas injector 113 and the susceptor 111 is closed to shield the organic materials while the substrate "S" is loaded and the power is supplied. After the chamber 110 is evacuated by a vacuum pump (not shown) to obtain a high vacuum condition, the shutter 116 is open, and the rotation shaft 121 and the gas injector 113 rotate. The carrier gases supplied through the carrier gas inlet 127 are heated up by the heater 130 and carry the organic materials evaporated in the evaporation source 140 to the gas injector 113. The carrier gases and the evaporated organic materials are diffused in a gas diffusing portion 115 of the gas injector 113 and sprayed through the plurality of injection holes 114. The sprayed organic materials are deposited onto the substrate "S" through the open patterns of the shadow mask 112 to form a thin film pattern of an organic material.

When the thin film pattern having a predetermined thickness is obtained, the shutter 116 is closed to shield the sprayed organic materials and the rotation shaft 121 stops rotating. The amount of the carrier gases increases to reduce the pressure of the chamber 110. Accordingly, the evaporation pressure of the organic materials decreases to reduce the evaporation amount of the organic materials. To supply a large amount of the carrier gases, an additional carrier gas reservoir may be formed. After the shadow mask 112 is removed from the substrate "S," the substrate "S" is unloaded and transferred from the chamber 110.

Figure 7:
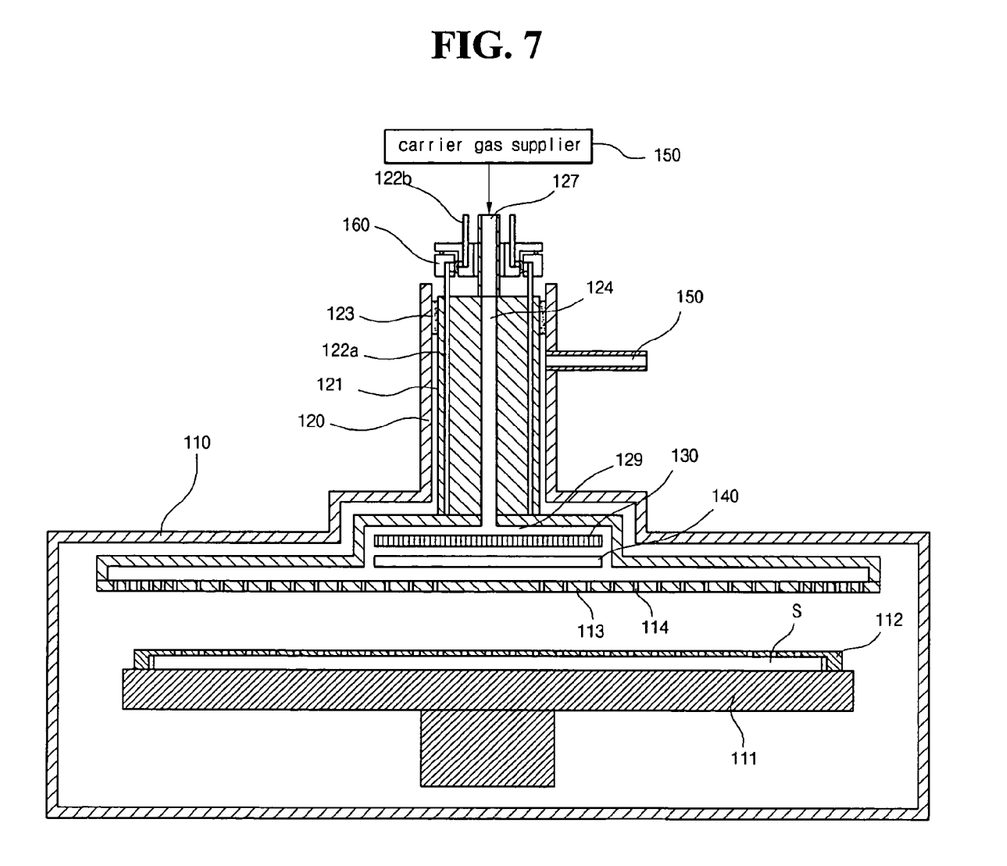
FIG. 7 is a schematic cross-sectional view showing an evaporation apparatus for forming an organic material thin film according to another embodiment of the present invention.

FIG. 7 is a schematic cross-sectional view showing an evaporation apparatus for forming an organic material thin film according to another embodiment of the present invention. Since the evaporation apparatus of FIG. 7 is similar to the evaporation apparatus of FIG. 3, illustrations regarding equal portions will be omitted.

In FIG. 7, a heater 130 and an evaporation source 140 are formed in a gas injector 113 to minimize a heat transmission to a magnetic seal 123. The gas injector 113 connected to a ration shaft 121 includes a containing portion 129, and the heater 130 and the evaporation source 140 are disposed in the containing portion 129. The containing portion 129 is protruded from a central top surface of the gas injector 113 and is connected to the rotation shaft 121. Accordingly, the rotation shaft 121 includes a flow path 124, and an extension cavity is not formed in the rotation shaft 121 contrary to an evaporation apparatus of FIG. 3. A cooling means is formed to protect the magnetic seal from heat of the heater and the evaporation source in FIG. 3. However, since the heater 130 and the evaporation source 140 is formed in the gas injector 121 far from the magnetic seal 123 in FIG. 7, an addition cooling means for the magnetic seal 123 may be omitted.

In the evaporation apparatuses in FIGS. 3 and 7, the carrier gases are pre-heated by the heater 130 and carry the organic materials evaporated in the evaporation source 140 to the gas injector 113. The gas injector sprays the evaporated organic materials. In another embodiment, the powder type organic materials may be supplied to the chamber from exterior and then the powder type organic materials may be evaporated in the gas injector.

Figure 8:
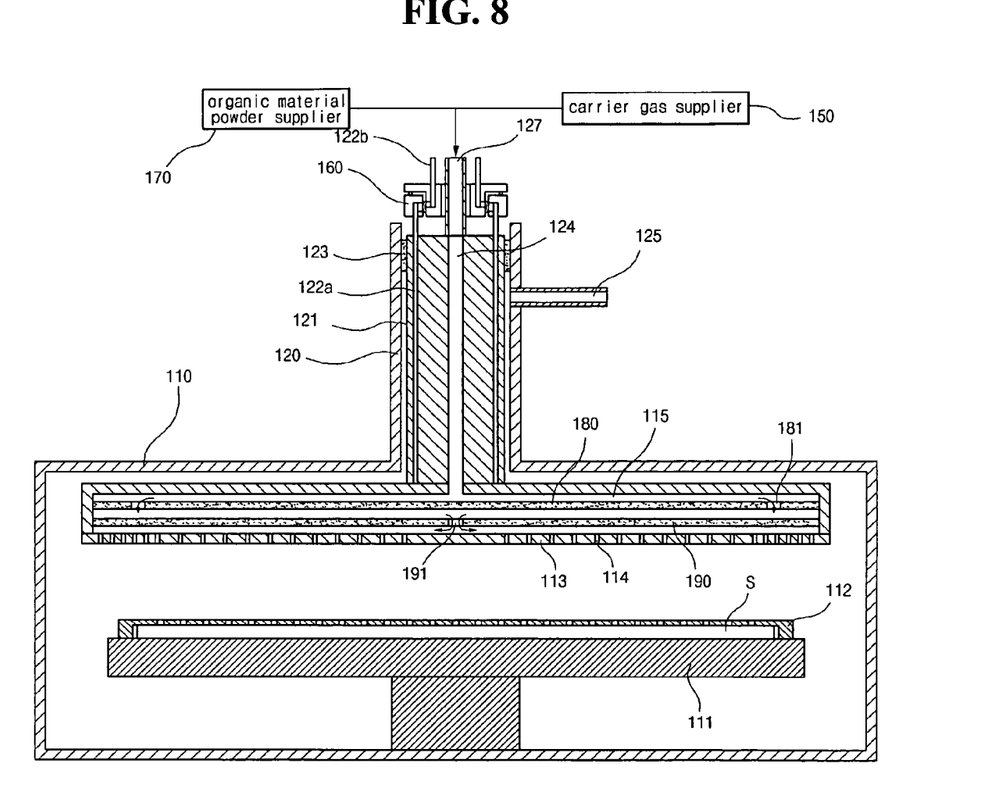
FIG. 8 is a schematic cross-sectional view showing an evaporation apparatus for forming an organic thin film according to another embodiment of the present invention.

FIG. 8 is a schematic cross-sectional view showing an evaporation apparatus for forming an organic thin film according to another embodiment of the present invention.

In FIG. 8, a gas injector 113 is connected to a rotation shaft 121. A flow path 124 is formed in the rotation shaft 121. First and second evaporation sources 180 and 190 are formed in the gas injector 113 to divide an inner space of the gas injector 113 horizontally. Carrier gases from a carrier gas supplier and powder type organic materials from an organic material powder supplier are supplied together to the gas injector 113 through the flow path 124 of the rotation shaft 121. The first and second evaporation sources 180 and 190 have an internal heater (not shown) and a power is supplied to the internal heater through a first power line 122a in the rotation shaft 121. The powder type organic materials are diffused and evaporated by the first and second evaporation sources 180 and 190 in the gas injector 113.

Figure 9A:
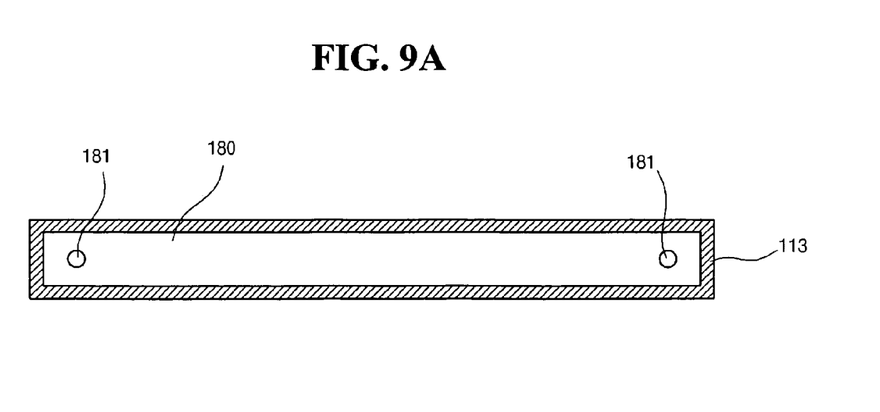
FIGS. 9A and 9B are schematic plane views showing first and second evaporation sources, respectively, of an evaporation apparatus for forming an organic material thin film according to another embodiment of the present invention.
Figure 9B:
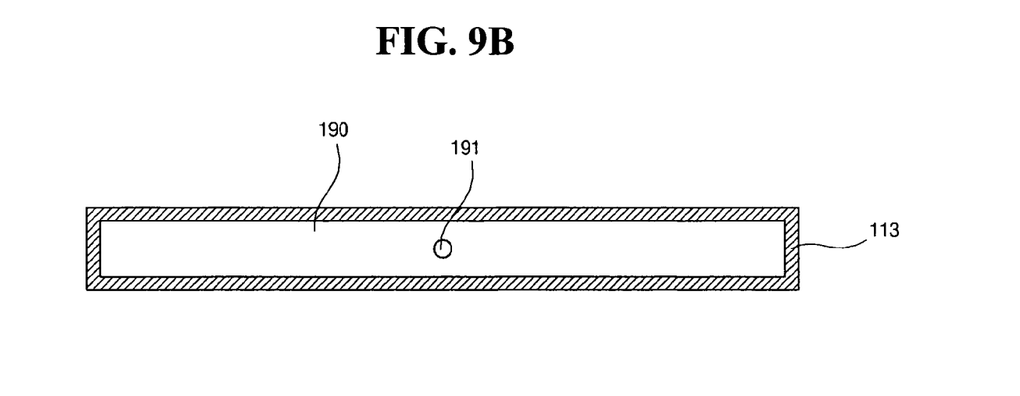

FIGS. 9A and 9B are schematic plane views showing first and second evaporation sources, respectively, of an evaporation apparatus for forming an organic material thin film according to another embodiment of the present invention.

In FIGS. 9A and 9B, each of the first and second evaporation sources 180 and 190 contacts an inner sidewall of the gas injector 113 to prevent passage of the organic materials through a gap between the evaporation source and the sidewall. Accordingly, each of the first and second evaporation sources 180 and 190 closely contacts the sidewall of the gas injector 113 without a gap. In addition, the first evaporation source 180 includes a plurality of first through holes 181 at a boundary portion, and the second evaporation source 190 includes a plurality of second through holes 191 at a central portion to elongate a flow path of the powder type organic materials. Since the rotation shaft 121 is connected to a central top surface of the gas injector 113, the powder type organic materials are supplied to a central portion over the first evaporation source 180. Next, the powder type organic materials at the central portion are diffused toward the plurality of first through holes 181 at the boundary portion, and then are diffused toward the plurality of second through holes at the central portion. The powder type organic materials are evaporated by the first and second evaporation sources 180 and 190. Accordingly, as the powder type organic materials have a longer flow path, the powder type organic materials are more completely evaporated. The flow path of the powder type organic materials are elongated and a sufficient evaporation of the powder type organic materials is obtained by alternately disposing the rotation shaft 121, the first through holes 181 and the second through holes 191. Even though two circular first through holes and one circular second through hole are shown in FIGS. 9A and 9B, a plurality of first through holes and a plurality of second through holes may be formed in another embodiment. In addition, the through holes may have a polygonal shape in another embodiment.

Figure 10:
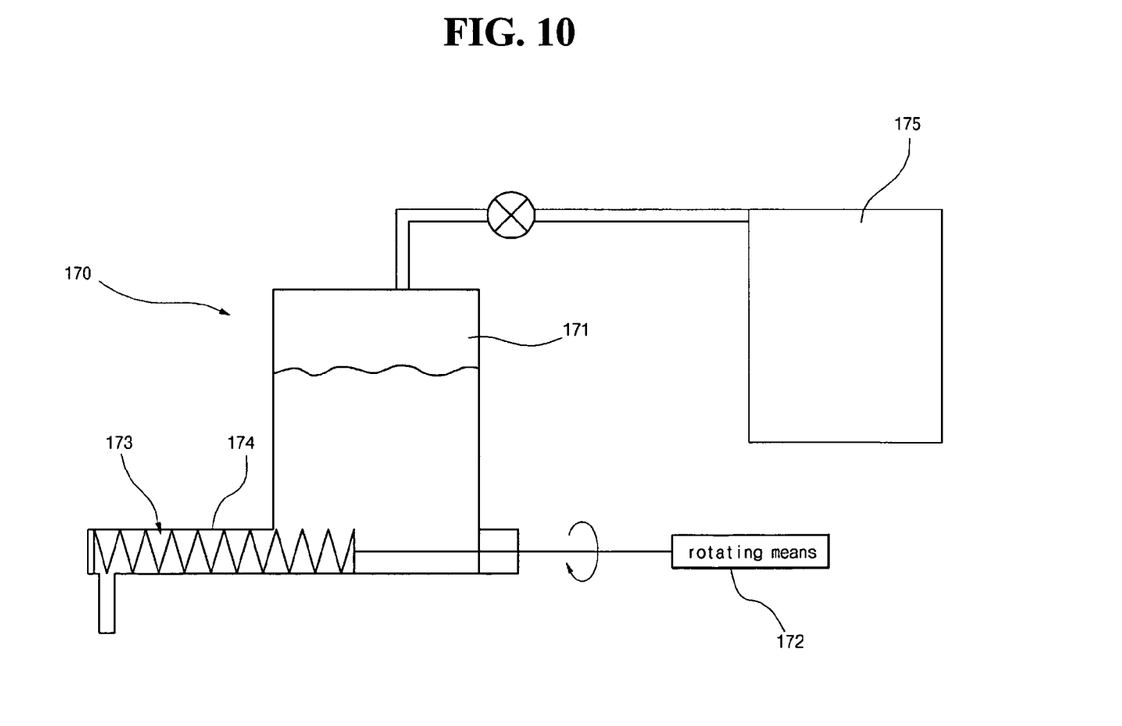
FIG. 10 is a schematic cross-sectional view showing an organic material supplier of an evaporation apparatus for forming an organic thin film according to another embodiment of the present invention.

The organic material supplier 170 (of FIG. 3) may include a screw to supply the powder type organic materials uniformly. FIG. 10 is a schematic cross-sectional view showing an organic material supplier of an evaporation apparatus for forming an organic thin film according to another embodiment of the present invention. In FIG. 10, the organic material supplier 170 includes a reservoir tank 171, an organic powder inlet 174 and a screw 173. The screw 173 is formed in the reservoir tank 171 and is driven by a screw rotating means 172 outside the reservoir tank 171. The organic powder inlet 174 is connected to the carrier gas inlet 127 (of FIG. 3). An amount of powder type organic materials are accurately adjusted by one revolution of the screw 173. Accordingly, the powder type organic materials are uniformly supplied by rotating the screw 173 with a constant velocity. In addition, a refill tank 175 may be connected to the reservoir tank 171 to supply the powder type organic materials continuously. The reservoir tank 171 may be automatically refilled by a sensor.

A process of forming an organic thin film using an evaporation apparatus of FIG. 8 will be illustrated hereinafter. After the substrate "S" is loaded on the susceptor 111, the shadow mask 112 having the open patterns are aligned over the substrate "S." A power is supplied to the first and second evaporation sources 180 and 190 to obtain a predetermined temperature. A shutter (not shown) between the gas injector 113 and the susceptor 111 is closed to shield the organic materials while the substrate "S" is loaded and the power is supplied. After the chamber 110 is evacuated by a vacuum pump (not shown) to obtain a high vacuum condition, the shutter is open, and the rotation shaft 121 and the gas injector 113 rotate. The screw rotating means 171 of the organic material powder supplier 170 drives the screw 173, and the powder type organic materials are supplied through the organic powder inlet 174 by rotation of the screw 173. The powder type organic materials passing through the organic powder inlet 174 are combined with the carrier gases. The powder type organic materials are transferred to the gas injector 113 through the flow path 124 in the rotation shaft 121 by the carrier gases. The powder type organic materials are evaporated by the first and second evaporation sources 180 and 190, and the evaporated organic materials are sprayed through the plurality of first and second through holes 181 and 191. The sprayed organic materials are deposited onto the substrate "S" through the open patterns of the shadow mask 112 to form a thin film pattern of an organic material.

When the thin film pattern having a predetermined thickness is obtained, the shutter is closed to shield the sprayed organic materials and the rotation shaft 121 stops rotating. The amount of the carrier gases increases to reduce the pressure of the chamber 110. Accordingly, the evaporation pressure of the organic materials decreases to reduce the evaporation amount of the organic materials. To supply a large amount of the carrier gases, an additional carrier gas reservoir may be formed. After the shadow mask 112 is removed from the substrate "S," the substrate "S" is unloaded and transferred from the chamber 110. Since the amount of the powder type organic materials are accurately adjusted, injection of a large amount of the carrier gases and closing of the shutter may be omitted.

In the present invention, since the susceptor is disposed at the lower portion of the chamber, the warpage of the shadow mask is prevented. In addition, since the organic materials evaporated in the chamber are sprayed using the rotational gas injector, the foot print of the evaporation apparatus is reduced and the uniformity of the organic thin film is improved.

It will be apparent to those skilled in the art that various modifications and variations can be made in the apparatus having a gas injector without departing from the spirit or scope of the invention. Thus, it is intended that the present invention covers the modifications and variations of this invention provided they come within the scope of the appended claims and their equivalents.

What is claimed is:

1. An apparatus for forming a thin film, comprising:
a chamber;
a susceptor in the chamber;
a gas injector over the susceptor, the gas injector having a plurality of injection holes and an inner space;
a shaft connected to the gas injector, the shaft having an extension cavity connected to the inner space and a flow path connected to the extension cavity, wherein the extension cavity is disposed in the chamber;
a housing surrounding the shaft, wherein the chamber and housing define a single interior space;
a magnetic seal between the housing and the shaft;
an evaporation source evaporating source materials and supplying evaporated source materials to the gas injector;
a carrier gas supplier supplying carrier gases; and
a heater for pre-heating the carrier gases,
wherein the evaporation source and the heater are disposed in the extension cavity,
wherein the evaporation source and the heater disposed in the extension cavity are located above the susceptor, and
wherein the evaporation source and the heater are disposed between the magnetic seal and the plurality of injection holes.

2. The apparatus according to claim 1, wherein the shaft rotates with the gas injector.

3. The apparatus according to claim 2, further comprising a first power line in the shaft, wherein one end of the first power line is connected to the evaporation source.

4. The apparatus according to claim 3, further comprising a slip ring connected to the other end of the first power line and a second power line connected to the slip ring.

5. The apparatus according to claim 1, wherein the carrier gas supplier is connected to the flow path and, wherein the carrier gases and the evaporated source materials are sprayed from the gas injector.

6. The apparatus according to claim 5, wherein the heater is disposed over the evaporation source in the extension cavity.

7. The apparatus according to claim 1, wherein the extension cavity has a diameter greater than a diameter of the flow path.

8. The apparatus according to claim 1, wherein the flow path is connected to a central portion of the gas injector.

9. The apparatus according to claim 8, wherein a concentration of injection holes has a minimum value at the central portion of the gas injector and gradually increases along with a distance from the central portion of the gas injector.

10. The apparatus according to claim 1, wherein the source material includes an organic material.

11. The apparatus according to claim 1, further comprising a purge gas inlet connected to the housing.

12. The apparatus according to claim 1, further comprising a cooling means for the magnetic seal connected to the housing.

13. The apparatus according to claim 1, wherein the gas injector includes an internal heater.

14. The apparatus according to claim 1, wherein the inner space is directly coupled to the extension cavity.

15. The apparatus of claim 1, wherein the shaft and the housing are spaced apart from each other to define the single interior space therebetween.

16. The apparatus of claim 1, wherein an outer sidewall of the shaft and an outer sidewall of the housing are parallel along their approximately entire lengths.

17. An apparatus for forming a thin film, comprising:
a chamber;
a susceptor in the chamber;
a gas injector over the susceptor, the gas injector having a plurality of injection holes and an inner space;

a shaft connected to the gas injector, the shaft having an extension cavity connected to the inner space and a flow path connected to the extension cavity, wherein the extension cavity is directly connected to the inner space;

a housing surrounding the shaft, wherein the chamber and the housing have a single interior space;

a magnetic seal between the housing and the shaft;

an evaporation source for evaporating source materials and for supplying evaporated source materials to the gas injector;

a carrier gas supplier for supplying carrier gases; and a heater for pre-heating the carrier gases, wherein the evaporation source and the heater are disposed in the extension cavity, wherein the evaporation source and the heater disposed in the extension cavity are located above the susceptor, and wherein the evaporation source and the heater are disposed between the magnetic seal and the plurality of injection holes.

18. The apparatus of claim 17, wherein the evaporation source and the heater are disposed directly above a center portion of the susceptor.

* * * * *